(12) United States Patent
Draxelmayr (10) Patent No.: US 10,784,879 B2
(45) Date of Patent: Sep. 22, 2020

(54) CIRCUIT ARRANGEMENT, CHARGE-REDISTRIBUTION ANALOG-TO-DIGITAL CONVERSION CIRCUIT, AND METHOD FOR CONTROLLING A CIRCUIT ARRANGEMENT

(71) Applicant: Infineon Technologies AG, Neubiberg (DE)

(72) Inventor: Dieter Draxelmayr, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/672,706

(22) Filed: Nov. 4, 2019

(65) Prior Publication Data
US 2020/0145016 A1  May 7, 2020

(30) Foreign Application Priority Data

Nov. 5, 2018  (EP) ..................................... 18204392

(51) Int. Cl.
*H03M 1/06* (2006.01)
(52) U.S. Cl.
CPC ................................ *H03M 1/0617* (2013.01)
(58) Field of Classification Search
USPC ......................................... 341/118, 172, 155
See application file for complete search history.

(56) References Cited

U.S. PATENT DOCUMENTS

| 6,046,719 | A | * | 4/2000 | Dingwall | ............. | G09G 3/2011 |
| | | | | | | 345/100 |
| 7,026,968 | B1 | | 4/2006 | Ali | | |
| 7,061,413 | B2 | * | 6/2006 | Boemler | ............. | H03M 1/1023 |
| | | | | | | 341/120 |
| 7,570,789 | B2 | * | 8/2009 | Fujiyoshi | ............. | G06K 9/0002 |
| | | | | | | 382/124 |
| 7,623,171 | B2 | * | 11/2009 | Rossi | ................... | G11C 27/026 |
| | | | | | | 348/302 |
| 8,422,316 | B2 | * | 4/2013 | Kajigaya | .................. | G11C 7/00 |
| | | | | | | 365/189.09 |
| 10,319,420 | B2 | * | 6/2019 | Chen | .................... | G11C 29/021 |
| 2004/0222351 | A1 | * | 11/2004 | Rossi | .................. | H04N 5/3575 |
| | | | | | | 250/208.1 |

(Continued)

*Primary Examiner* — Jean B Jeanglaude
(74) *Attorney, Agent, or Firm* — Murphy, Bilak & Homiller, PLLC (57) ABSTRACT

A circuit arrangement includes charge stores logically arranged in an array configuration having logical columns of charge stores including at least first, second, third and fourth columns of charge stores. A control circuit is configured to control a switching network operably coupled to the charge stores, and to affect a first circuit configuration in a first time segment and a second circuit configuration in a second time segment, the circuit configurations being different from one another. In the first circuit configuration, the first and third columns of charge stores receive a first polarity component of a differential signal, and the second and fourth columns of charge stores receive a second polarity component of the differential signal. In the second circuit configuration, the first and second columns of charge stores receive the first polarity component, and the third and fourth columns of charge stores receive the second polarity component.

19 Claims, 8 Drawing Sheets

(56) References Cited

U.S. PATENT DOCUMENTS

| | | | |
|---|---|---|---|
| 2008/0036749 A1* | 2/2008 | Moriyama | G09G 3/2092 345/204 |
| 2011/0188325 A1* | 8/2011 | Kajigaya | G11C 7/00 365/189.09 |
| 2018/0083645 A1 | 3/2018 | Monangi et al. | |
| 2018/0294017 A1* | 10/2018 | Chen | G11C 7/12 |

* cited by examiner

CIRCUIT ARRANGEMENT, CHARGE-REDISTRIBUTION ANALOG-TO-DIGITAL CONVERSION CIRCUIT, AND METHOD FOR CONTROLLING A CIRCUIT ARRANGEMENT

TECHNICAL FIELD

Examples relate to a circuit arrangement, a charge-redistribution analog-to-digital conversion circuit and a method for controlling a circuit arrangement.

BACKGROUND

Capacitors are used in a wide range of applications, e.g. to store charges within a sample-and-hold circuit. Dielectric absorption, sometimes also called dielectric relaxation, is an effect that may occur in capacitors, and which may lead to error charges that remain within the capacitors, e.g. if the clock speed of a circuit arrangement having the capacitor is faster than the recovery time of the capacitor.

There may be a desire for an improved concept for circuit arrangements comprising charge stores, which enables a mitigation of the effects of dielectric absorption.

SUMMARY

Some embodiments relate to a circuit arrangement comprising a plurality of charge stores. The plurality of charge stores is logically arranged in an array configuration comprising a plurality of logical columns of charge stores. The plurality of logical columns of charge stores comprise at least a first, a second, a third and a fourth column of charge stores. The circuit arrangement further comprises a switching network operably coupled to the plurality of charge stores. The circuit arrangement further comprises a control circuit configured to control the switching network. The control circuit is configured to affect a first circuit configuration in a first time segment and a second circuit configuration in a second time segment. The first circuit configuration and the second circuit configuration are different from one another. In the first circuit configuration the first and third columns of charge stores receive a first polarity component of a differential signal. In the first circuit configuration the second and fourth columns of charge stores receive a second polarity component of the differential signal. In the second circuit configuration the first and second columns of charge stores receive the first polarity component of the differential signal. In the second circuit configuration the third and fourth columns of charge stores receive the second polarity component of the differential signal.

Some embodiments relate to a charge-redistribution analog-to-digital conversion circuit comprising a circuit arrangement. The circuit arrangement comprises a plurality of charge stores. The plurality of charge stores is logically arranged in an array configuration comprising a plurality of logical columns of charge stores. The plurality of logical columns of charge stores comprise at least a first, a second, a third and a fourth column of charge stores. The circuit arrangement further comprises a switching network operably coupled to the plurality of charge stores. The circuit arrangement further comprises a control circuit configured to control the switching network. The control circuit is configured to affect a first circuit configuration in a first time segment and a second circuit configuration in a second time segment. The first circuit configuration and the second circuit configuration are different from one another. In the first circuit configuration the first and third columns of charge stores receive a first polarity component of a differential signal. In the first circuit configuration the second and fourth columns of charge stores receive a second polarity component of the differential signal. In the second circuit configuration the first and second columns of charge stores receive the first polarity component of the differential signal. In the second circuit configuration the third and fourth columns of charge stores receive the second polarity component of the differential signal. The first time segment and the second time segment each comprise a first phase and a second phase. The control circuit is configured to affect the switching network such, that in the first phase of each time segment the plurality of logical columns of charge stores are charged using the differential signal, and such that in the second phase of each time segment, charge redistribution is per-formed among the plurality of charge stores. The first phase of each time segment is a sampling phase of the charge-redistribution analog-to-digital conversion circuit. The second phase of each time segment is a redistribution phase of the charge-redistribution analog-to-digital conversion circuit.

Some embodiments relate to a method for controlling a circuit arrangement. The circuit arrangement comprises a plurality of charge stores. The plurality of charge stores is logically arranged in an array configuration comprising a plurality of logical columns of charge stores. The plurality of logical columns of charge stores comprise at least a first, a second, a third and a fourth column of charge stores. The circuit arrangement comprises a switching network operably coupled to the plurality of charge stores. The method comprises controlling the switching network. The method comprises affecting a first circuit configuration in a first time segment. The method comprises affecting a second circuit configuration in a second time segment. The first circuit configuration and the second circuit configuration are different from one another. In the first circuit configuration the first and third columns of charge stores receive a first polarity component of a differential signal. In the first circuit configuration the second and fourth columns of charge stores receive a second polarity component of the differential signal. In the second circuit configuration the first and second columns of charge stores receive the first polarity component of the differential signal. In the second circuit configuration the third and fourth columns of charge stores receive the second polarity component of the differential signal.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two Elements.

The terminology used herein for the purpose of describing particular examples is not intended to be limiting for further examples. Whenever a singular form such as "a," "an" and "the" is used and using only a single element is neither explicitly nor implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

At least some embodiments may relate to a mitigation of dielectric absorption. Dielectric absorption, sometimes also called dielectric relaxation, is an effect that may occur in capacitors. In integrated circuits this effect might not be big, so it is often neglected. However, to build circuits of higher accuracy this effect might be important, as the effect might impact any switched capacitor (SC) circuit. In many cases, this effect is not very well characterized and may seem to depend on several processing steps as a by-product. Modeling may be done by one or more parasitic RC (Resistor Capacitor) terms in parallel to a main capacitor. In effect, preconditioning may store some information (charge) in a capacitor that more or less slowly decays over time. If the clock speed of a circuit is faster than the recovery time some error charge may remain and will be processed undistinguishable from the correct information (charge).

In many cases, there are attempts to avoid this effect by proper processing. One obvious drawback is the dependence on processing at a foundry for a parameter which might not be specified, and therefore might not be under process control. There may be a desire for providing an improved approach for addressing the effect in capacitor circuits.

Figure 1A:
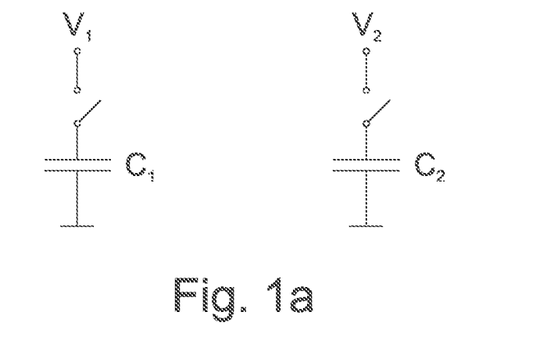
FIG. 1a shows a schematic diagram of a differential circuit arrangement.

In a simplified example of the approach of at least some embodiments, a differential circuit comprises two capacitors to store some information (FIG. 1a). If there is some different pre-condition still residing in the two capacitors, after a short period of sampling the new information there might be some overlaid error, depending on the preconditioning. In effect, sampling always the same value nevertheless might lead to some slightly different results if the previous samples were different. In at least some circuits, this may be seen as crosstalk between channels.

Figure 1B:
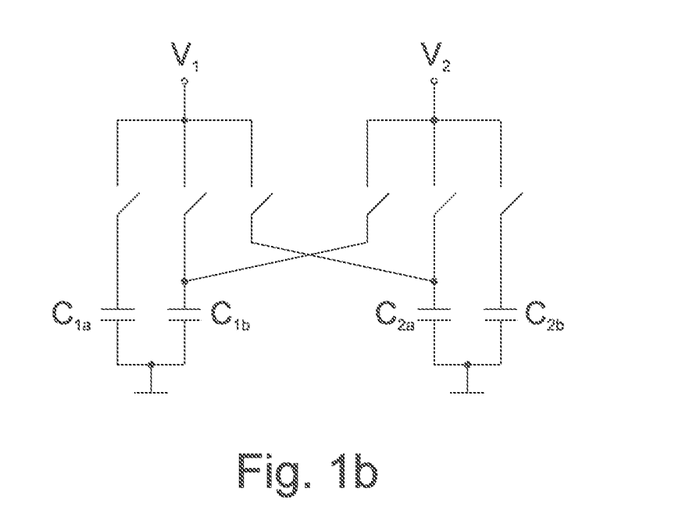
FIG. 1b shows a schematic diagram of a further differential circuit arrangement.

FIG. 1b shows a similar arrangement. Capacitors C1 and C2 have been split into two parts, each of them half of the original capacitor. If now in one sampling phase capacitors C1a and C1b sample V1, and capacitor C2a and C2b sample V2, it may be assumed that C1a and C1b see some voltage, leading to some memory, and capacitors C2a and C2b see some other voltage, leading to some other memory. Thus, the memory of capacitors C1a and C1b may be the same. This is also true for capacitors C2a and C2b. If in the next clock cycle capacitors C1a and C2a sample voltage V1, and capacitors C1b and C2b sample voltage V2 both compound capacitors (C1a+C2a; C1b+C2b) may have some memory, but this memory may be the same memory. Therefore the memory might impact the charge to be stored, but it might be basically the same impact in both compound capacitors. In a differential circuit, this may result in a common mode error and therefore will not have an impact on the differential signal.

If there remain spurs of memory for longer than two clock cycles, the concept may be extended: a capacitor may be split into 4, or 8, . . . pieces and these pieces may be permutated and recombined to cancel also those effects. However, there may be a tradeoff between mitigation and effort. Therefore, further aspects are described in terms of a split into two capacitors.

This concept may for example be applied to a thermometer coded SAR ADC (Successive Approximation Analog-to-Digital Converter). The (differential) main capacitor array may comprise (2×) 256 capacitors, each of them having a capacitance of a few fF, forming a dense array. Theoretically, each of these capacitors could be split into two pieces to apply the concept. However, this may be limited by layout constraints.

Figure 1C:
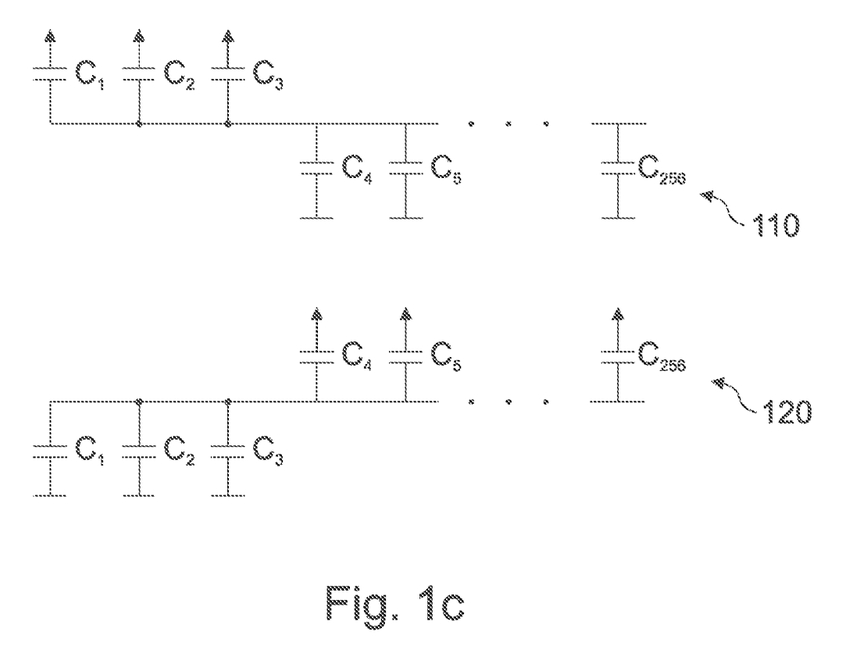
FIG. 1c shows a schematic diagram of a part of a charge-redistribution successive approximation analog-to-digital converter.
Figure 1D:
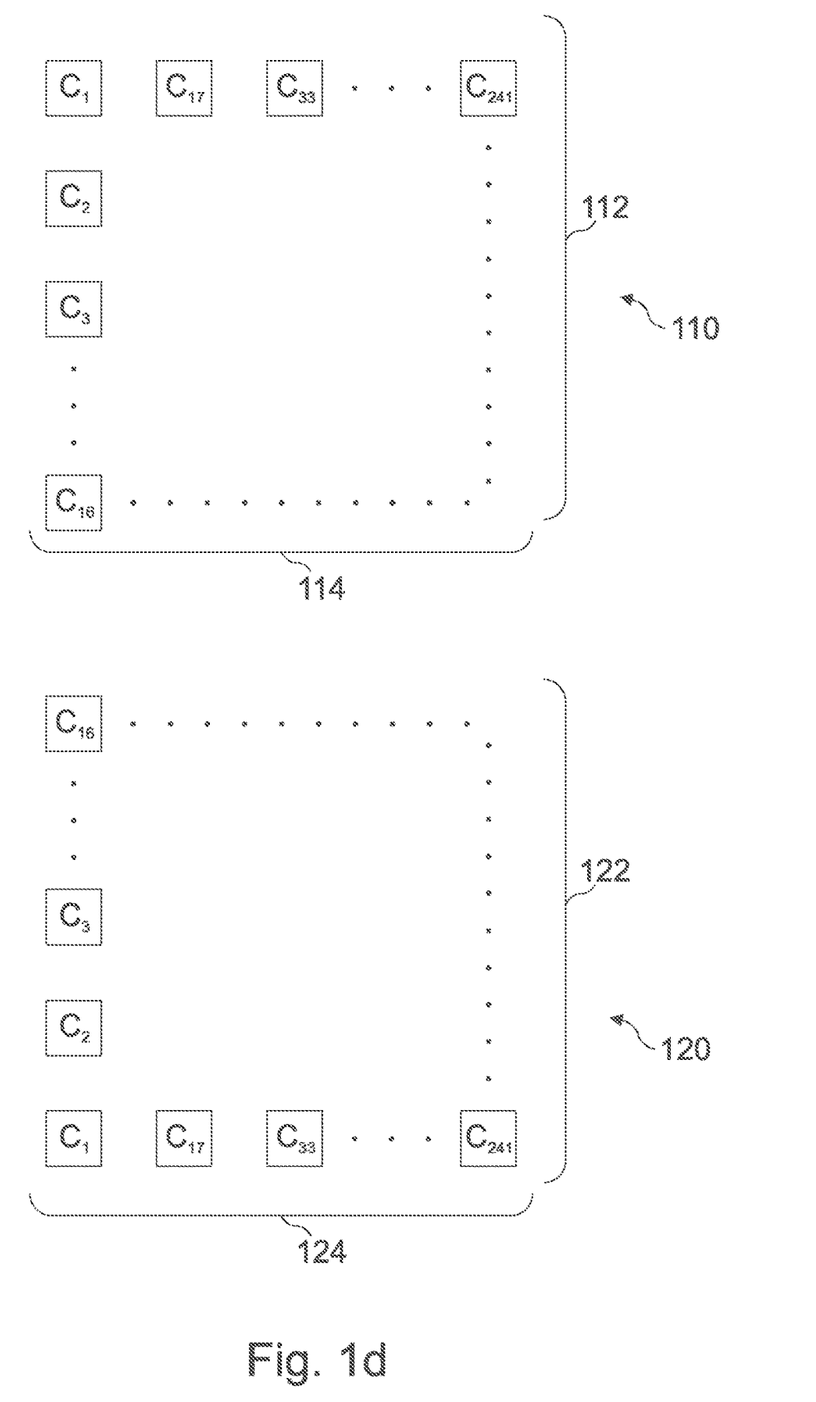
FIG. 1d shows a network of capacitors arranged in an array configuration.

FIG. 1c shows a simplified detail out of the ADC, a charge-redistribution SAR ADC with thermometer encoded DAC (Digital-to-Analog Converter). FIG. 1c shows the network after having converted a specific voltage. The upper 110 and the lower array 120 stand for the two differential networks. For example, FIG. 1c may show the network during the redistribution phase. Depending on the input voltage (and the conversion result), the capacitors may be in some specific configuration and, according to the general concept, each of them might be split into two capacitors to be able to commutate between upper and lower array. FIG. 1d shows an exemplary layout configuration. Again, reference numbers 110 and 120 refer to the upper and to the lower array. The networks of FIG. 1d are organized like memories, in rows and columns, e.g. rows 112 and columns 114 of the upper array 110 and rows 122 and columns 124 of the lower array 120. If each capacitor were to be split into two pieces and the pieces to be interchanged between the two arrays, a high effort might be required for wiring and switching. At least some embodiments are based on a novel concept hereafter named "column switching".

Figure 1E:
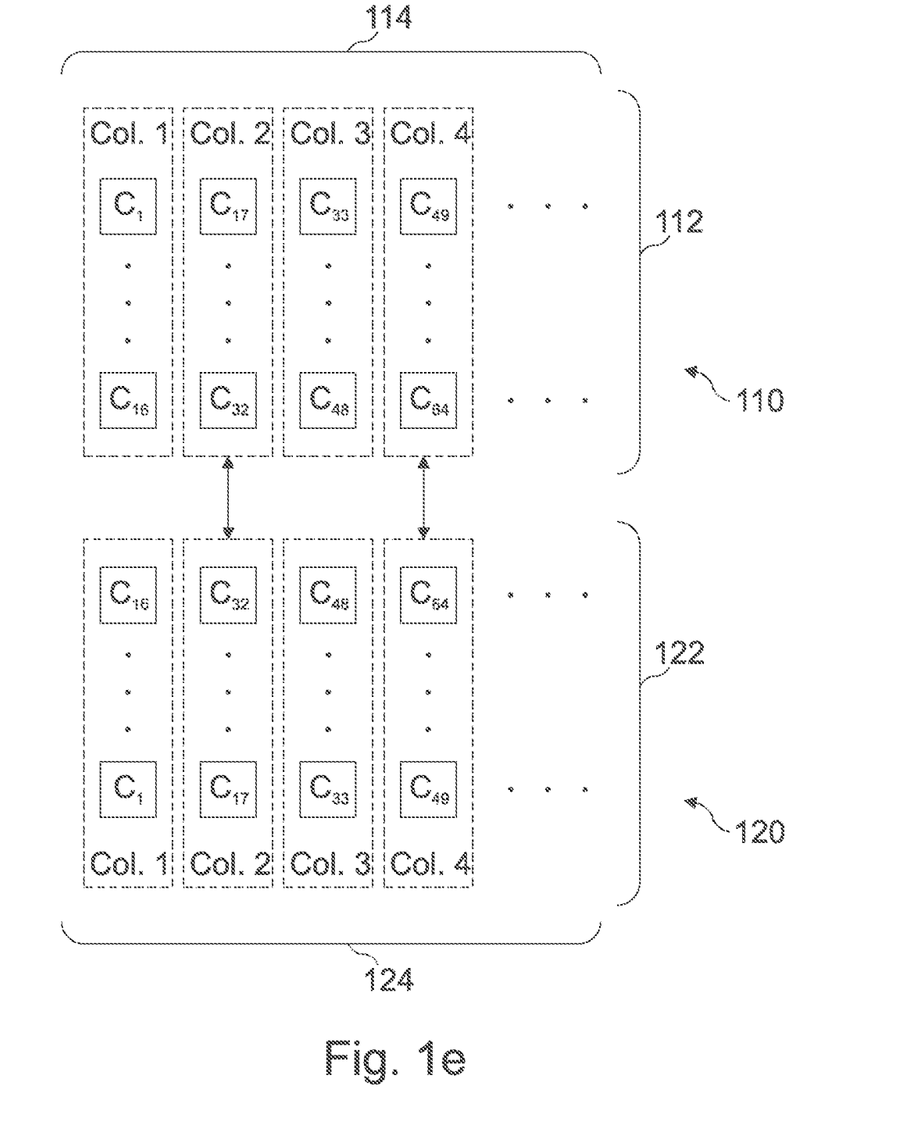
FIG. 1e shows a network of capacitors arranged in an array configuration with a plurality of logical columns of capacitors.

FIG. 1e shows the network of FIG. 1d. In addition to FIG. 1d, the capacitors may be grouped by logical columns of the array. Embodiments might not be based on swapping single capacitor pieces, but whole columns. Embodiments may be based on swapping entire logical columns of capacitors. This may be feasible as, in a thermometer coded array, neighboring columns might basically have the same information, with the exception of one column where the transition takes place. Therefore each second column may act as replica for their preceding column (with the exception of the transition region). Therefore these two columns again may be suitable for equalizing their respective memory effect. This may lead to less effort and an easier implementation in layout than the splitting of individual capacitors. Memory effects in the transition region might not necessarily be equalized. However, this might only be a fraction of the complete array and therefore contribute only a fraction of the original error.

At least some embodiments may be based on splitting capacitors into pieces and swapping the pieces. If a large capacitor already comprises a plurality of pieces, these pieces might be used for swapping.

Figure 2A:
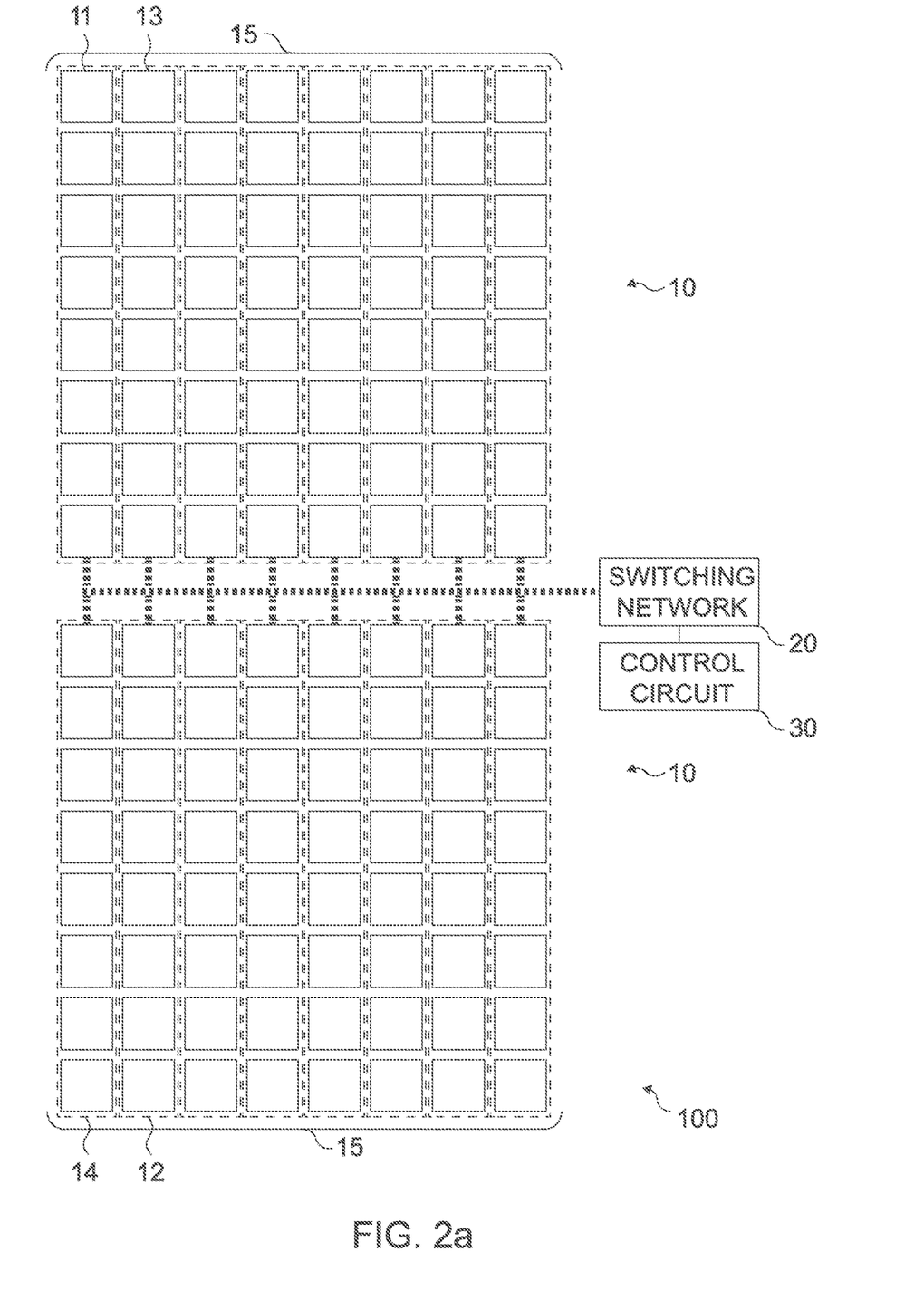
FIGS. 2a and 2b show schematic drawings of embodiments of a circuit arrangement.
Figure 2B:
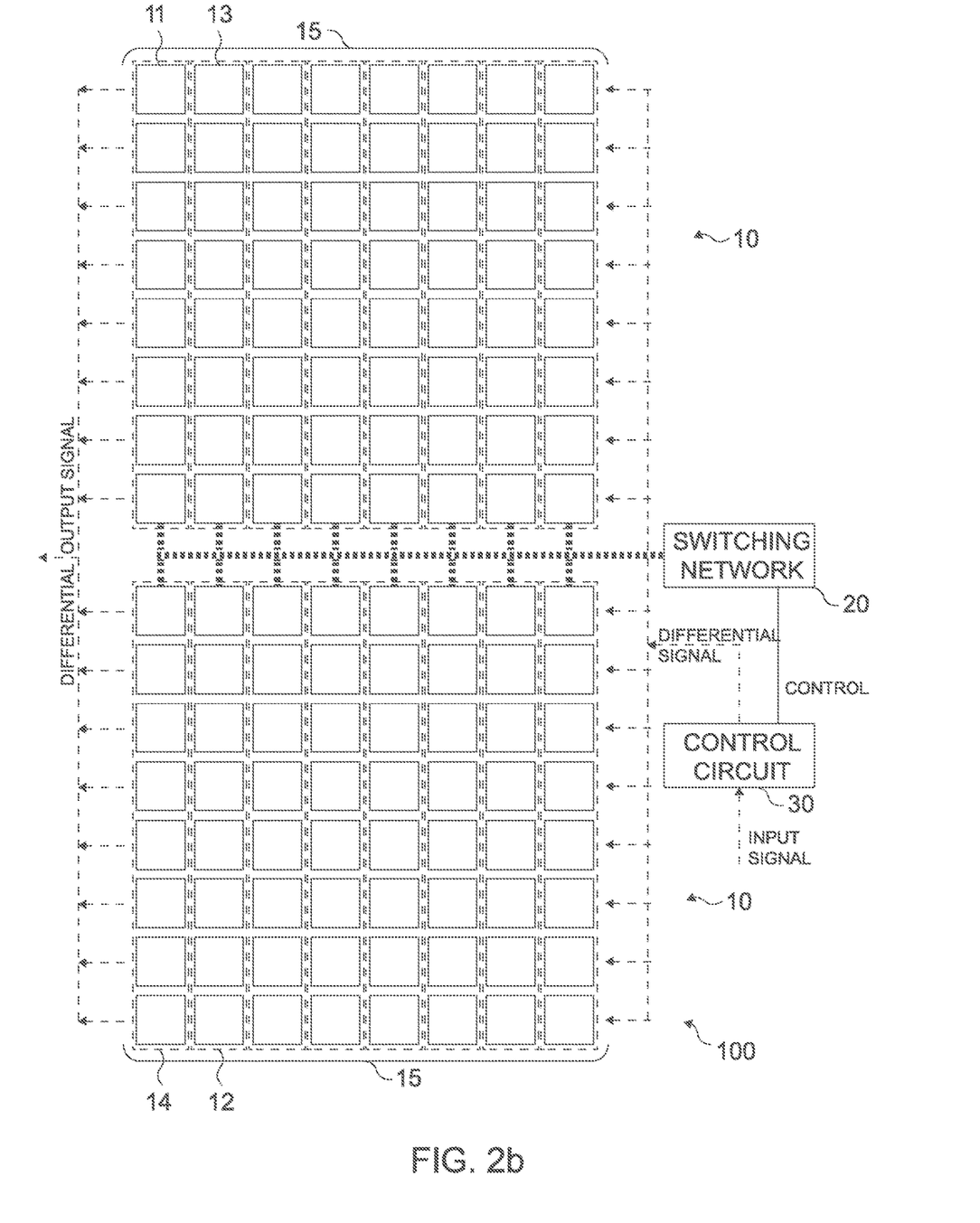

FIGS. 2a and 2b show schematic diagrams of embodiments of a circuit arrangement 100. The circuit arrangement 100 comprises a plurality of charge stores 10. The plurality of charge stores is logically arranged in an array configuration comprising a plurality of logical columns of charge stores 15. In the following, the logical columns of charge stores may alternatively be denoted "columns of charge stores", "logical columns" or "columns". The plurality of logical columns of charge stores comprise at least a first 11, a second 12, a third 13 and a fourth 14 column of charge stores. The circuit arrangement 100 comprises a switching network 20 operably coupled to the plurality of charge stores. The circuit arrangement comprises a control circuit 30 configured to control the switching network. The control circuit 30 is configured to affect a first circuit configuration in a first time segment and a second circuit configuration in a second time segment. In other words, via the switching network, the control circuit 30 is configured to cause the circuit to take the first circuit configuration during the first time segment and the second circuit configuration in the second time segment. The first circuit configuration and the second circuit configuration are different from one another. In the first circuit configuration the first 11 and third 13 columns of charge stores receive a first polarity component of a differential signal. In the first circuit configuration the second 12 and fourth 14 columns of charge stores receive a second polarity component of the differential signal. In the second circuit configuration the first 11 and second 12 columns of charge stores receive the first polarity component of the differential signal. In the second circuit configuration the third 13 and fourth 14 columns of charge stores receive the second polarity component of the differential signal.

Changing how the logical columns of charge stores are connected between the first time segment and the second time segment may enable the first, second, third and fourth logical column of charge stores to accumulate substantially the same residual charges. If the charges are output using a differential output signal, the residual error may be a common mode error, which might not have an impact on the differential output signal. By swapping entire logical columns of charge stores, a wiring required for swapping the logical columns between the first and second time segment may be reduced, making the approach feasible for a large number of charge stores.

For example, the circuit arrangement may be a sample-and-hold circuit arrangement. In a sample-and-hold circuit, the charge equalization may be used to improve an accuracy of a differential output signal of the sample-and-hold circuit arrangement. For example, the circuit arrangement, e.g. the sample-and-hold circuit arrangement, may use the plurality of charge stores to store charges corresponding to the differential signal during a first phase (e.g. a sample phase) of each time segment, and to provide an output signal based on the stored charges in a second phase (e.g. a hold phase) of each time segment. For example, the first time segment and the second time segment may each comprise a first phase (or sample phase) and a second phase (or hold phase). The control circuit 30 may be configured to affect the switching network such, that in the first phase of each time segment, the plurality of logical columns of charge stores are charged using the differential signal, and that in the second phase of each time segment a differential output signal is generated based on the charges stored within the plurality of logical columns of charge stores 15. Due to charge equalization, a residual error caused by dielectric absorption may be the substantially the same on both polarity components of the differential output signal, and might thus be comprised in a common mode of the differential output signal.

As such, the circuit arrangement might not only be used for sample-and-hold circuit arrangements, but also for other circuits. In an abstract way, it might not be important what the capacitors exactly are doing, if there is a regular exchange of which capacitors are connected in parallel. For example, the circuit arrangement may be a circuit arrangement of a charge redistribution successive approximation analog-to-digital conversion circuit.

Figure 2C:
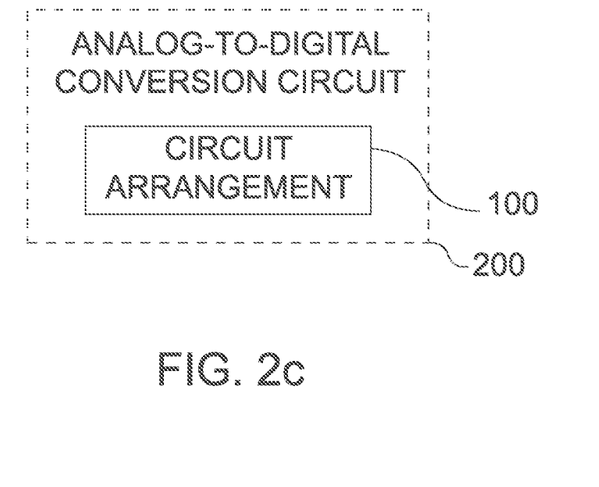
FIG. 2c shows a block diagram of an embodiment of an analog-to-digital conversion circuit comprising a circuit arrangement.

FIG. 2c shows a block diagram of an embodiment of an analog-to-digital conversion circuit 200 comprising the circuit arrangement. For example, the analog-to-digital conversion circuit 200 may be a charge-redistribution successive approximation analog-to-digital conversion circuit 200. The circuit arrangement may be part of a charge-redistribution ADC. In this case, the capacitors/charge stores may undergo a sampling and a redistribution phase, and next time, when the capacitors are going to be exchanged, they again undergo a sample and a redistribution phase. In this case, as in the above case, the first phase may be the sampling phase of the charge redistribution successive approximation analog-to-digital conversion circuit. The second phase may be the redistribution phase of the charge redistribution successive approximation analog-to-digital conversion circuit. The differential output signal may be provided to a comparison circuit of the charge redistribution successive approximation analog-to-digital conversion circuit. The control circuit 30 may be configured to affect the switching network such, that in the second phase (the redistribution phase) of each time segment, charge redistribution is performed among the plurality of charge stores (e.g. based on the differential signal). To this effect, as described in more detail below, the control circuit 30 may be configured to generate the differential signal based on an input code. The generated differential signal may be suitable for performing the successive approximation using the plurality of charge stores.

In at least some embodiments, the concept may be used for a Digital-to-Analog Conversion (DAC) circuit. Embodiments provide a DAC circuit comprising the circuit arrangement. In literature, the capacitive network of a charge-redistribution ADC is sometimes called the "DAC". If the comparison circuit connected to the two networks is replaced by an amplification circuit, the circuit arrangement can be operated as a DAC. The DAC circuit may comprise the circuit arrangement and the amplifier circuit. Similar to the example above, the differential output signal for the circuit arraignment may be provided to the amplification circuit. Another embodiment is a "Flip-Around DAC" (derived from a flip-around Sample/Hold). The bottom plates of the network may be connected together and may be connected to the output of an amplifier in the second time segment.

For example, the plurality of charge stores may be a plurality of capacitors, e.g. a plurality of capacitors laid out in an array configuration (in hardware) in an integrated circuit device. Similar to memory, the plurality of charge stores are arranged in an array configuration. The array configuration may e.g. comprise a plurality of logical rows and a plurality of logical columns. The terms "rows" and "columns" may be used interchangeably throughout the document, as the definition of row and column changes depending on the viewpoint. Consequently, the plurality of logical columns may also be a plurality of logical rows. Each logical column may comprise a plurality of charge stores (corresponding to the plurality of logical rows intersecting the logical column). For example, each logical column may comprise at least 4 (e.g. a multiple of four such as 4, 8, 12, 16 . . . ) charge stores. The plurality of logical columns comprises at least 4 (e.g. a multiple of four such as 4, 8, 12, 16, 32, 64) logical columns of charge stores.

In various embodiments, the capacitors may be and remain individual capacitors, which may be connected to either the first or the second polarity component of the differential signal by the switching network. For example, if the plurality of charge stores comprises 2×256 individual capacitors, they will remain 2×256 individual capacitors. They might be connected in parallel if the control circuit/algorithm decides so, but not necessarily. So, in some cases, in the first circuit configuration, the first and third columns are connected together in parallel and the second and fourth columns are connected in parallel, and in the second circuit configuration, the first and second columns and the third and fourth columns may be connected in parallel. In general, in embodiments, in the second configuration the second column 12 and third column 13 are swapped, so e.g. the first and second columns may be connected in parallel, as may be the third and fourth, if each capacitor is in the same position, or they might not be connected in parallel, depending on the state of the switching network. FIG. 1c shows one point in time during the charge redistribution process. At other points in time this picture might be different; some other capacitors might be connected to the positive/negative reference voltage. In at least some embodiments, each single capacitor can be switched independently from some other capacitor, so no static parallel-connection may be in place, but the switching network may enable a parallel connection.

In at least some embodiments, the array configuration comprises a first logical array associated with the first polarity component of the differential signal and a second logical array associated with the second polarity component of the differential signal. Each logical column within the first logical array may have a logical counterpart in the second logical array. At least one logical column of the first logical array (e.g. the third logical column) may be logically swapped with its counterpart (e.g. the second logical column) of the second logical array if the control circuit affects a transition from the first circuit configuration to the second circuit configuration or from the second circuit configuration to the first circuit configuration. For example, a logical column of the first logical array may be a counterpart of a logical column of the second logical array if both logical columns receive the same respective signal component of the plurality of signal components, albeit from different polarity components of the differential signal.

The plurality of charge stores and the switching network may form two (differential) networks, being used for the task they are intended to being used. In the second time segment 50% of the capacitors may be exchanged between the networks (via switches), e.g. between the first logical array and the second logical array. Preferably, capacitors having the same information may be taken apart. For example, half of the capacitors may stay in the original network (e.g. the first or second logical array), and half of the capacitors may be transferred to the other network (e.g. to the second or first logical array). Therefore, in a thermometer coded network, the neighbors may change place because in a thermometer coded network neighbors have a high likelihood to have the same information. The neighbors may be logical neighbors (neighboring codes or addresses), not necessarily neighbors in layout.

As shown in FIGS. 2a and 2b, the plurality of logical columns of charge stores comprise at least a first 11, a second 12, a third 13 and a fourth 14 column of charge stores. The locations of the first, second, third and fourth column within FIGS. 2a and 2b is merely chosen to illustrate the concept. Other locations are possible. In at least some embodiments, the first and the second logical columns and the third and the fourth logical columns are (logically) neighboring columns within the array configuration. Alternatively, as shown in FIGS. 2a and 2b, the first and the third logical columns and the second and the fourth logical columns are (logically) neighboring columns within the array configuration. This may enable the charge equalization, as if the differential signal is a thermometer-code based differential signal, these neighboring columns have been subjected to similar charges. Neighbors may be logical neighbors (neighboring codes), not necessarily topological neighbors. In embodiments, the physical locations of the logical columns may be scrambled to get better linearity. Consequently, the neighborship may be a logical neighborship. For example, the above-mentioned columns may be logical neighbors in relation to the plurality of signal components within the differential signal. Capacitances of the plurality of logical columns of charge stores 15 may be substantially equal. For example, an overall capacitance of each (single) column of the plurality of logical columns of charge stores, e.g. each of the second 12, third 13 and fourth 14 logical column of charge stores, may differ by at most 20% (or at most 15%, at most 10%, at most 5%, at most 2%, at most 1%) of an overall capacitance of the first logical column of charge stores 11 from the overall capacitance of the first logical column of charge stores 11. In other words, a sum of the capacitances of the charge stores of a logical column of charge stores, e.g. of the second 12, third 13 or fourth 14, may differ by at most 20% (or at most 15%, at most 10%, at most 5%, at most 2%, at most 1%) from a sum of the capacitances of the charge stores of the first logical column of charge stores 11. Thus, the sum of the capacitances of the first logical column of charge stores may be substantially equal to the sum of the capacitances of the second logical column of charge stores etc. This may enable an interchangeability of the logical columns. Furthermore, the error charges of the logical columns having substantially equal capacitances may be similar, enabling charge equalization.

FIGS. 2a and 2b show such an array configuration, with two sub-arrays (one shown in the top half of the Figs., one in the bottom half). In other systems, each sub-array might be used for a polarity component of the differential. Thus, each sub-array would be assigned to one of the two polarity components of the differential signal. In embodiments, the assignment of charge stores to polarity components is non-static, e.g. it may change depending on whether the first circuit configuration or the second circuit configuration is affected.

The plurality of charges stores are connected to a differential signal. In this description, the term "connected" may be interpreted as "electrically connected" or "ohmic electrically connected". The differential signal comprises (or consists of) two polarity components. The two polarity components of the differential signal may have equal amplitude and opposite polarity relative to a common-mode voltage of the differential signal. The two polarity components may be two groups of signals (e.g. polarity groups) that are mutually symmetric relative to the common-mode voltage of the differential signal. Each polarity group may comprise a plurality of signal components. The plurality of signal components of the first polarity group (or first polarity component) and the plurality of signal components of the second polarity group (or second polarity component) may be symmetric relative to the common-mode voltage of the differential signal. Each of the plurality of charge stores may be coupled/connected to (exactly) one polarity component of the two polarity components. Consequently, each of the plurality of charge stores may receive either the first polarity component of the differential signal or the second polarity component of the differential signal. Which of the polarity components of the differential signal is received by a charge store of the plurality of charge stores may change for at least the charge stores of the second and third logical column of charge stores based on whether the first or the second circuit configuration is affected. For example, the control circuit may be configured to control the switching network such that within at least a first phase of the first time segment, the first and third columns of charge stores are connected to the first polarity component of the differential signal and the second and fourth columns of charge stores are connected to the second polarity component of the differential signal. The control circuit may be configured to control the switching network such that within at least a first phase of the second time segment, the first and second columns of charge stores are connected to the first polarity component of the differential signal and the third and fourth columns of charge stores are connected to the second polarity component of the differential signal.

The plurality of charge stores may be column-wise coupled to the first or the second polarity component of the differential signal. For example, the switching network 20 may be configured to connect all charge stores of a logical column to the same polarity component of the differential signal. This may facilitate a wiring required to support the first and second circuit configuration. For example, the switching network may comprise multiplexing circuitry to connect entire columns of the plurality of logical columns either to the first polarity component or to the second polarity component. The control circuit 30 may be configured to control which polarity component of the differential signal the logical column of charge stores is connected to, based on the first circuit configuration (during the first time segment) and based on the second circuit configuration (during the second time segment). By assigning entire columns to one of the two polarity components, a wiring required to support the first and second circuit configuration may be facilitated. Within a time segment, a logical column of the plurality of logical columns may be statically connected to either the first polarity component or to the second polarity component.

The control circuit 30 may be configured to alternate between the first circuit configuration and the second circuit configuration. This may provide charge equalization between at least the first, second, third and fourth logical column of charge stores. The second circuit configuration may be operable to provide charge equalization between the respective logical columns of charge stores. For example, the second circuit configuration may be operable to provide charge equalization between logical columns one and two and between logical columns three and four. If the first circuit configuration follows the second circuit configuration, the second circuit configuration may be operable to provide charge equalization between logical columns one and three and between logical columns two and four. The charge equalization may enable the first, second, third and fourth logical column of charge stores to accumulate substantially the same residual charges. If the charges are output using a differential output signal, the residual error may be a common mode error, which might not have an impact on the differential output signal.

In at least some embodiments, each polarity component of the differential signal comprises a plurality of signal components. The plurality of signal components of the first polarity component and the plurality of signal components of the second polarity component may have opposite polarity relative to a common-mode voltage of the differential signal. Corresponding signal components of the plurality of signal components of the first and the second polarity component may have opposite polarity relative to a common-mode voltage of the differential signal. The plurality of signal components may be used to individually charge the plurality of charge stores. For example, in the circuit arrangement of FIGS. 2a and 2b, signal components of a polarity component may be connected to charge stores of the first column, and corresponding signal components of the opposite polarity component may be connected to charge stores of the fourth column. Accordingly, further signal components of a polarity component may be connected to charge stores of the third column, and corresponding signal components of the opposite polarity component may be connected to charge stores of the second column.

The control circuit 30 may be configured to control the switching network 20 to individually connect the plurality of signal components of the polarity components of the differential signal to the plurality of charge stores 10. For example, individual charge stores within a logical column of charge stores may be individually connected to signal components of a polarity component of the differential signal. Within a logical column, a first charge store may be connected, via the switching network, to a first signal component of a polarity component, and a second charge store may be connected to second signal component of the same polarity component, wherein the first and second signal component are different from another. By individually charging the plurality of charge stores, a higher granularity of the overall charge of the plurality of charge stores associated with a polarity component of the differential signal may be achieved.

For example, the differential signal may be based on a thermometer coding. The differential signal may be a thermometer-coded signal. In other words, the plurality of signal components of the polarity components may form a thermometer-coded composite signal. For example, the plurality of signal components may be arranged in a logical sequence of signal components. Within the logical sequence of signal components, subsequent signal components may have the same value, except at the position within the logical sequence, at which the thermometer code transitions (e.g. from high to low, from low to high, from 1 to 0 or from 0 to 1). Within the plurality of signal components of a polarity component, each signal component may have the same value as logically adjacent signal components of the polarity component, except where the transitions within the thermometer code occurs. If the differential signal is based on a thermometer coding, neighboring logical columns, except the one, at which a transition in the thermometer coding occurs, receive the same charges, which enables a charge equalization when the logical columns are swapped.

The circuit arrangement comprises the switching network 20, which is operably coupled to the plurality of charge stores. For example, the switching network may be configured to connect the plurality of charge stores to the plurality of signal components of the polarity components of the differential signal. The switching network 20 may be controlled by the control circuit 30. For example, the switching network may comprise a plurality of switches coupled to the plurality or charge stores. The plurality of switches may be configured to selectively connect the plurality of charges to one of two or more reference potentials (e.g. as introduced in the following). The switching network may comprise two or more voltage rails for the two or more reference potentials and the plurality of switches to selectively connect the plurality of charge stores to one of the two or more reference potentials. In at least some embodiments, the plurality switches may be configured to float at least one terminal of the charge stores, e.g. within a hold phase of the first or second time segment. The control circuit 30 may be configured to control the plurality of switches, e.g. to affect the first circuit configuration or the second circuit configuration.

For example, the first circuit configuration and the second circuit configuration may correspond to first and second sample configurations. In other words, the first circuit configuration (or first sample configuration) and the second circuit configuration (or second sample configuration) may control, which signal component or polarity component is sampled by the plurality of charge stores during the first phase (the sample phase) of the time segments. The first and second circuit configuration may each comprise a first sub-configuration for the first phase and a second sub-configuration for the second phase of the respective time segments. The first sub-configuration may be suitable for connecting the plurality of charge stores to the differential signal, so that the differential signal is sampled by the plurality of charge stores during the first phase. The second sub-configuration may be suitable for providing the output signal or for redistribution the charges during the redistribution phase.

In at least some embodiments, as shown in FIG. 2b, the control circuit 30 is configured to generate the differential signal based on an input signal using the switching network 20. The control circuit may be configured to connect charge stores of the plurality of charge stores to one of two or more reference potentials based on the input signal and based on the first or the second circuit configuration. For example, the two or more reference potentials may correspond to or comprise at least two elements of the group of a ground potential, a positive reference potential and a negative reference potential. The control circuit may be configured to affect the connection of the plurality of charge stores to the two or more reference potentials based on the input signal and based on the first or the second circuit configuration. For example, the first or the second circuit configuration may specify which of the plurality of columns are to be used for which polarity component of the differential signal, and the input signal may specify which signal component of the plurality of signal components is to be connected to which reference potential of the two or more reference potentials. For example, the input signal, and correspondingly the differential signal, may change within the time segments. The control circuit may be configured to alter the differential signal based on the input signal within the time segments, e.g. within the phases of the time segments. The differential signal may be based on the input signal and based on two or more reference potentials. Generating the differential signal from the input signal may enable generating the differential signal such, that approximately equal charges that are based on the two polarity components are equalized, e.g. by generating a thermometer-coded differential signal. For example, the differential signal may be based on a thermometer code. The differential signal may be a thermometer-coded differential signal.

In at least some examples, the input signal is based on a thermometer coding. The input signal may be a thermometer-coded input signal. This may facilitate the generation of the differential signal. For example, the input signal may comprise a plurality of input signal components arranged in a logical sequence. Within the thermometer-coded input signal, the logical sequence of input signal components may comprise zero or a single transition between a first value (e.g. first voltage level) and a second value (e.g. a second voltage level). The thermometer-coded input signal may comprise a first logical sequence of the first value and a second logical sequence of the second value. Each input signal component of the input signal may affect an equal number of charge stores of the plurality of charge stores.

Alternatively the input signal is based on a binary coding. For example, the input signal may be a binary-coded input signal. The input signal may comprise a plurality of input signal components arranged in a logical sequence. The logical sequence may comprise a most significant position and a least significant position. Traversing the logical sequence from the least significant position to the most significant position, each subsequent position within the logical sequence may affect twice the number of charge stores of the plurality of charge stores as the preceding position within the logical sequence. The binary coding may either be translated into a thermometer-code for the differential signal, or each binary position might be assigned to a multiple of two charge stores, e.g. two charge stores, four charge stores, 8 charge stores, 16 charge stores (or 1 logical column, if a column comprises 16 charge stores), 2 logical columns etc. For example, the least significant position/least significant bit might occupy only a fraction of a column. For example, the least significant position may be associated with a charge store C1, the next higher position with charge stores C2+C3, etc. Again for higher valued positions, taking a plurality of columns, it might be possible to swap columns to get charge cancellation, whereas for lower valued bits/positions, the swap might not provide perfect charge cancellation (especially if the phenomenon is non-linear). This is similar to the thermometer case, where there may be a transition in some column mainly reflecting the LSBs. A charge store that is not being used for a binary coding scheme (e.g. if the overall number of charge stores within a logical column is $2^n$ and only $2^n-1$ charge stores are used) may be designated a dummy charge store and controlled via a dummy signal within the input signal.

In some examples, the input signal may be based on a non-binary coding. In other words, the input signal may be a non-binary coded signal. A non-binary coded signal may be a signal, in which the significance of input signal components is not determined based on a factor of two, e.g. not based on a static multiplication factor between adjacent input signal components. A non-binary coding may be used to support application-specific requirements. Each input signal component of the input signal may affect a pre-defined number of charge stores of the plurality of charge stores. The pre-defined number of charge stores may be based on a non-binary coding scheme of the non-binary coding.

Figure 3:
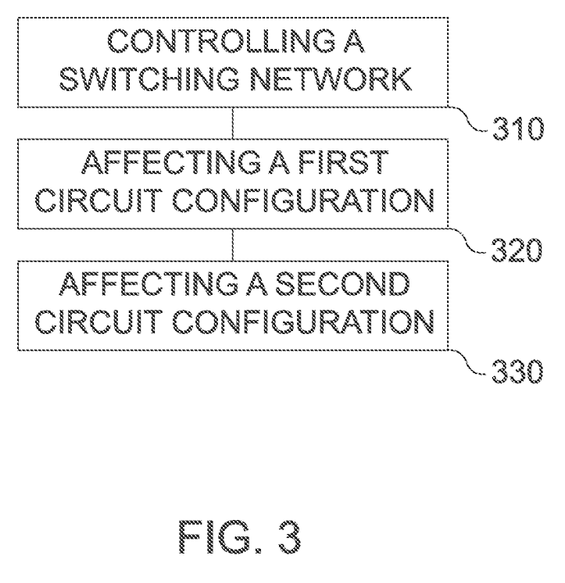
FIG. 3 shows a flow chart of a method for controlling a circuit arrangement.

FIG. 3 shows a flow chart of a method for controlling a circuit arrangement. The circuit arrangement may be implemented similar to the circuit arrangement introduced in connection with FIGS. 2a to 2c. The circuit arrangement comprises a plurality of charge stores. The plurality of charge stores is logically arranged in an array configuration comprising a plurality of logical columns of charge stores. The plurality of logical columns of charge stores comprise at least a first, a second, a third and a fourth column of charge stores. The circuit arrangement comprises a switching network operably coupled to the plurality of charge stores. The method comprises controlling 310 the switching network. The method further comprises affecting 320 a first circuit configuration in a first time segment. The method further comprises affecting 330 a second circuit configuration in a second time segment. The first circuit configuration and the second circuit configuration are different from one another. In the first circuit configuration the first and third columns of charge stores receive a first polarity component of a differential signal. In the first circuit configuration the second and fourth columns of charge stores receive a second polarity component of the differential signal. In the second circuit configuration the first and second columns of charge stores receive the first polarity component of the differential signal. In the second circuit configuration the third and fourth columns of charge stores receive the second polarity component of the differential signal.

Changing how the logical columns of charge stores are connected between the first time segment and the second time segment may enable the first, second, third and fourth logical column of charge stores to accumulate substantially the same residual charges. If the charges are output using a differential output signal, the residual error may be a common mode error, which might not have an impact on the differential output signal. By swapping entire logical columns of charge stores, a wiring required for swapping the logical columns between the first and second time segment may be reduced, making the approach feasible for a large number of charge stores.

The method may further comprise one or more features introduced in connection with FIGS. 2a to 2c. For example, the method may comprise controlling the switching network to individually connect the plurality of signal components of the polarity components of the differential signal to the plurality of charge stores. The method may comprise connecting all charge stores of a logical column to the same polarity component of the differential signal using the switching network. The method may comprise controlling which polarity component of the differential signal the logical column of charge stores is connected to, based on the first circuit configuration and based on the second circuit configuration. The method may comprise alternating between the first circuit configuration and the second circuit configuration. The method may comprise generating the differential signal based on an input signal using the switching network. The charge stores of the plurality of charge stores may be connected to one of two or more reference potentials based on the input signal and based on the first or the second circuit configuration. The differential signal may be based on the input signal and based on two or more reference potentials. In some examples, the first time segment and the second time segment each comprise a first phase and a second phase. The method may comprise affecting the switching network such, that in the first phase of each time segment the plurality of logical columns of charge stores are charged using the differential signal, and that in the second phase of each time segment a differential output signal is generated based on the charges stored within the plurality of logical columns of charge stores.

More details and aspects of the method are mentioned in connection with the proposed concept or one or more examples described above (e.g. FIG. 1a to 2c). The method may comprise one or more additional optional features corresponding to one or more aspects of the proposed concept or one or more examples described above or below.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a signal", "means for generating a signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A circuit arrangement, comprising:
a plurality of charge stores logically arranged in an array configuration comprising a plurality of logical columns of charge stores, the plurality of logical columns of charge stores comprising at least a first, a second, a third and a fourth column of charge stores;
a switching network operably coupled to the plurality of charge stores; and
a control circuit configured to control the switching network so as to affect a first circuit configuration in a first time segment and a second circuit configuration in a second time segment, the first circuit configuration and the second circuit configuration being different from one another,
wherein in the first circuit configuration, the first and the third columns of charge stores receive a first polarity component of a differential signal, and the second and the fourth columns of charge stores receive a second polarity component of the differential signal,
wherein in the second circuit configuration, the first and the second columns of charge stores receive the first polarity component of the differential signal, and the third and the fourth columns of charge stores receive the second polarity component of the differential signal.

2. The circuit arrangement of claim 1, wherein each polarity component of the differential signal comprises a plurality of signal components.

3. The circuit arrangement of claim 2, wherein the control circuit is configured to control the switching network to individually connect the plurality of signal components of the polarity components of the differential signal to the plurality of charge stores.

4. The circuit arrangement of claim 1, wherein the switching network is configured to connect all charge stores of a logical column to a same polarity component of the differential signal.

5. The circuit arrangement of claim 4, wherein the control circuit is configured to control which polarity component of the differential signal the logical column of charge stores is connected to, based on the first circuit configuration and based on the second circuit configuration.

6. The circuit arrangement of claim 1, wherein the array configuration comprises a first logical array associated with the first polarity component of the differential signal and a second logical array associated with the second polarity component of the differential signal, wherein each logical column within the first logical array has a logical counterpart in the second logical array, and wherein at least one logical column of the first logical array is logically swapped with its counterpart of the second logical array if the control circuit affects a transition from the first circuit configuration to the second circuit configuration or from the second circuit configuration to the first circuit configuration.

7. The circuit arrangement of claim 1, wherein the differential signal is based on a thermometer coding.

8. The circuit arrangement of claim 1, wherein an overall capacitance of each of the second, the third and the fourth logical columns of charge stores differs by at most 20% of an overall capacitance of the first logical column of charge stores from an overall capacitance of the first logical column of charge stores.

9. The circuit arrangement of claim 1, wherein capacitances of the plurality of logical columns of charge stores are substantially equal.

10. The circuit arrangement of claim 1, wherein the second circuit configuration is operable to provide charge equalization between the respective logical columns of charge stores.

11. The circuit arrangement of claim 1, wherein the control circuit is configured to alternate between the first circuit configuration and the second circuit configuration.

12. The circuit arrangement of claim 1, wherein the control circuit is configured to generate the differential signal based on an input signal using the switching network, wherein the control circuit is configured to connect charge stores of the plurality of charge stores to one of two or more reference potentials based on the input signal and based on the first or the second circuit configuration, and wherein the differential signal is based on the input signal and based on two or more reference potentials.

13. The circuit arrangement of claim 12, wherein the input signal is based on a thermometer coding.

14. The circuit arrangement of claim 12, wherein the input signal is based on a binary coding.

15. The circuit arrangement of claim 12, wherein the input signal is based on a non-binary coding.

16. The circuit arrangement of claim 1, wherein the circuit arrangement is a sample-and-hold circuit arrangement.

17. The circuit arrangement of claim 1, wherein the first time segment and the second time segment each comprise a first phase and a second phase, wherein the control circuit is configured to affect the switching network such that in the first phase of each time segment, the plurality of logical columns of charge stores are charged using the differential signal, and such that in the second phase of each time segment, a differential output signal is generated based on the charges stored within the plurality of logical columns of charge stores.

18. A charge-redistribution analog-to-digital conversion circuit, comprising:
   a circuit arrangement comprising:
      a plurality of charge stores logically arranged in an array configuration comprising a plurality of logical columns of charge stores, the plurality of logical columns of charge stores comprising at least a first, a second, a third and a fourth column of charge stores;
      a switching network operably coupled to the plurality of charge stores; and
      a control circuit configured to control the switching network so as to affect a first circuit configuration in a first time segment and a second circuit configuration in a second time segment, the first circuit configuration and the second circuit configuration being different from one another,
      wherein in the first circuit configuration, the first and the third columns of charge stores receive a first polarity component of a differential signal, and the second and the fourth columns of charge stores receive a second polarity component of the differential signal,
      wherein in the second circuit configuration, the first and the second columns of charge stores receive the first polarity component of the differential signal, and the third and the fourth columns of charge stores receive the second polarity component of the differential signal,
      wherein the first time segment and the second time segment each comprise a first phase and a second phase,
      wherein the control circuit is configured to affect the switching network such that in the first phase of each time segment, the plurality of logical columns of charge stores are charged using the differential signal, and such that in the second phase of each time segment, charge redistribution is performed among the plurality of charge stores,
      wherein the first phase of each time segment is a sampling phase of the charge-redistribution analog-to-digital conversion circuit,
      wherein the second phase of each time segment is a redistribution phase of the charge-redistribution analog-to-digital conversion circuit.

19. A method for controlling a circuit arrangement having a plurality of charge stores, wherein the plurality of charge stores is logically arranged in an array configuration comprising a plurality of logical columns of charge stores, wherein the plurality of logical columns of charge stores comprise at least a first, a second, a third and a fourth column of charge stores, and wherein the circuit arrangement comprises a switching network operably coupled to the plurality of charge stores, the method comprising:
   controlling the switching network;
   affecting a first circuit configuration in a first time segment; and
   affecting a second circuit configuration in a second time segment,
   wherein the first circuit configuration and the second circuit configuration are different from one another,
   wherein in the first circuit configuration, the first and the third columns of charge stores receive a first polarity component of a differential signal, and the second and the fourth columns of charge stores receive a second polarity component of the differential signal,
   wherein in the second circuit configuration, the first and the second columns of charge stores receive the first polarity component of the differential signal, and the third and the fourth columns of charge stores receive the second polarity component of the differential signal.

* * * * *